(12) United States Patent
Okada et al.

(10) Patent No.: US 6,477,191 B1
(45) Date of Patent: Nov. 5, 2002

(54) SEMICONDUCTOR LASER DEVICE, SEMICONDUCTOR LASER MODULE, RARE-EARTH-ELEMENT-DOPED OPTICAL FIBER AMPLIFIER AND FIBER LASER

(75) Inventors: Satoru Okada; Tsuyoshi Fujimoto; Yasuo Oeda, all of Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 09/538,728

(22) Filed: Mar. 30, 2000

(30) Foreign Application Priority Data

Apr. 9, 1999 (JP) ............................................ 11-102774
Apr. 12, 1999 (JP) ........................................... 11-104606

(51) Int. Cl.$^7$ ................................................ H01S 5/00
(52) U.S. Cl. ............................. 372/46; 372/50; 372/92; 372/102; 372/44; 372/36; 372/96; 372/45; 372/43; 372/75
(58) Field of Search ........................... 372/46, 50, 102, 372/44, 92, 96, 45, 36, 43, 75; 59/341

(56) References Cited

U.S. PATENT DOCUMENTS 5,229,879 A * 7/1993 Gen-ei ........................ 359/344

FOREIGN PATENT DOCUMENTS

| JP | 62166583 | 7/1987 |
| JP | 8316566 | 11/1996 |
| JP | B2265624 8 | 5/1997 |

OTHER PUBLICATIONS

A. Takemoto et al., "1.3$\mu$m Distributed Feedback Laser Diode with a Grating Accurately Controlled by a New Fabrication Technique", Journal of Lightwave Technology, vol. 7, No. 12, Dec. 1989, U.S.A., pp.2072–2077.

T. Earles et al., "1.1W continuous–wave, narrow spectral width (<1A) emission from broad–stripe, distributed–feedback, diode lasers ($\lambda \times 0.893\mu$m)", Applied Physics Letters, vol. 73, No. 15, Oct. 12, 1998, U.S.A., pp. 2072–2074.

* cited by examiner

*Primary Examiner*—Paul Ip
*Assistant Examiner*—Delma R. Flores Ruiz
(74) *Attorney, Agent, or Firm*—Birch, Stewart, Kolasch & Birch, LLP

(57) ABSTRACT

A semiconductor laser device includes: an active layer; upper waveguide layers and a lower waveguide layer sandwiching the active layer therebetween; upper and lower cladding layers sandwiching the active layer and the upper and lower waveguide layers therebetween; and a current-narrowing layer defining a current-injection region for injecting current to the active layer, wherein a diffraction grating having a periodical structure in a resonance cavity direction is buried in any one of the waveguide layers, the diffraction grating being present in at least a part of the current-injection region; and the waveguide layer in which the diffraction grating is buried and the cladding layer adjoining to that waveguide layer forms an interface which is substantially flat in the resonance cavity direction. With the constitution, a waveguide structure which has a diffraction grating offering a higher flexibility in design and manufacture in terms of the coupling efficiency is realized, thereby easily providing a dynamic single-mode semiconductor laser device with higher reproducibility, yield and reliability.

9 Claims, 15 Drawing Sheets

US 6,477,191 B1

SEMICONDUCTOR LASER DEVICE, SEMICONDUCTOR LASER MODULE, RARE-EARTH-ELEMENT-DOPED OPTICAL FIBER AMPLIFIER AND FIBER LASER

BACKGROUND OF THE INVENTION

1. Field of the Invention

The present invention relates to semiconductor laser devices which have a waveguide structure with a diffraction grating for controlling-the longitudinal mode, like dynamic single-mode semiconductor laser devices such as a distributed feedback semiconductor laser and a distributed bragg reflector semiconductor laser, and also relates to semiconductor laser modules, rare-earth-element-doped optical fiber amplifiers and fiber lasers using the same.

2. Description of the Related Art

There are known distributed feedback (DFB) semiconductor lasers, distributed bragg reflector (DBR) semiconductor lasers and the like as a semiconductor laser (laser diode(LD)) realizing a dynamic single-mode oscillation. Any one of these laser diodes has a waveguide structure incorporating therein a diffraction grating with a wavelength selecting function. Waveguide structures based on a stepped refractive index profile, in general, comprise a waveguide layer having a higher refractive index sandwiched between cladding layers having a lower refractive index. Prior art technologies will be summarized with attention given to the location of the diffraction grating in the waveguide structure.

An example of a first prior art technology is disclosed in Japanese Unexamined Patent Publication JP-A 8-316566 (1996) in which a diffraction grating is formed at the interface between a waveguide layer and a cladding layer. FIG. 16 is a sectional view, taken along the resonance cavity of a DFB laser diode, of the art shown in the Publication. FIG. 17 is a schematic view of the refractive index profile, as viewed vertically, of the waveguide structure. In this prior art reference, an unevenness is provided at the interface between an upper waveguide layer 41 and an upper cladding layer 42 to form an index modulation diffraction grating 43. This diffraction grating 43 is formed in the following manner: crystal growth is performed up to the upper waveguide layer; subsequently, the unevenness is formed on the surface by ordinary two-beam holographic lithography process and wet etching process; and crystal growth is performed again to form the upper cladding layer and its succeeding layers, thereby burying the unevenness to complete the grating.

An example of a second prior art technology is disclosed in Journal of Lightwave Technology, Vol. 7, No. 12, pp. 2072–2077, 1989, "1.3-$\mu$m Distributed Feedback Laser Diode with a Grating Accurately Controlled by a New Fabrication Technique", in which a diffraction grating is buried within a cladding layer. FIG. 18 is a sectional view, taken along the resonance cavity, of this art. FIG. 19 is a schematic diagram of the refractive index profile, as viewed vertically, of the waveguide structure. Within a cladding layer 53 of n-InP, a diffraction grating comprising a diffraction grating layer 52 of n-InGaAsP having a higher refractive index than the cladding layer is buried. In this art, crystal growth is performed to form a barrier layer 51 of n-InP and the diffraction grating layer 52 of n-InGaAsP; subsequently, the resultant stacked structure is subjected to a two-beam holographic lithography process and a wet etching process to form a plurality of trenches having a depth reaching the barrier layer 51, the trenches being oriented perpendicular to the resonance cavity to form a striped structure; and finally, this striped structure is covered with the cladding layer 53 of n-InP that is the same material as that of the barrier layer, thereby completing the diffraction grating 54.

The coupling efficiency of a buried diffraction grating is determined by the following factors: sectional configuration of the diffraction grating, thickness, distance between the diffraction grating and the center of the waveguide structure, refractive indices of the diffraction grating layer and the layer in which the diffraction grating layer is buried, and the like. The literature of the second prior art mentions some advantages of the art including: reduced influence on the guided mode due to the cladding layer and barrier layer of the same composition, higher thickness controllability of the diffraction grating layer in the crystal growth, and like merits.

The coupling efficiency of the unevenness-type diffraction grating like the first prior art technology can be designed by adjusting the factors such as configuration of the unevenness, depth, distance between the diffraction grating and the center of the waveguide structure, refractive index of each of the layers lying on and under the diffraction grating. However, the design of the waveguide structure, including the location of the waveguide layer/cladding layer interface, is largely limited by the guided mode configuration and the beam-divergence angle. Further, the material (refractive index) of the waveguide layer is also limited to keep satisfactory the crystal quality of a portion adjacent the crystal re-growth interface. For this reason, the number of factors based on which the coupling efficiency of the unevenness-type diffraction grating can be designed independently of the waveguide structure is small, and thus, the design freedom has been largely restricted. Furthermore, the depth of the unevenness formed by wet etching is required to be controlled uniformly and accurately so as to form the unevenness-type diffraction grating having the coupling efficiency in conformity with the design. It is, however, difficult to control the wet-etching depth with precision and, hence, difficult to secure the uniformity and reproducibility of the coupling efficiency.

On the other hand, the guided mode propagating within the waveguide structure based on a stepped refractive index profile is configured concentrated in the waveguide layer having a higher refractive index, while on the other hand the intensity of the guided mode is rapidly attenuated in a exponential function fashion within the cladding layer having a lower refractive index. Since the coupling efficiency is determined by the overlap between the guided mode and the diffraction grating, it is required that the diffraction grating buried within the cladding layer as in the second prior art technology be located with a higher precision to provide the diffraction grating with a predetermined coupling efficiency. For this reason, strict limitation is imposed on both the design and the manufacture, resulting in a limited allowance. In semiconductor laser diodes of which the oscillation wavelength is about 1 $\mu$m or smaller, in particular, Al-containing materials such as AlGaAs are frequently used for the cladding layer having a lower refractive index. In the case of the diffraction grating buried in the cladding layer formed of such an Al-containing material, it is very difficult to clean a surface of the cladding layer that has been oxidized during the formation of the diffraction grating prior to the crystal re-growth. For this reason, the crystal quality of a portion adjacent the crystal re-growth interface may be deteriorated, resulting in a danger that the reliability of the resultant device is lowered.

As described above, there has been a strong demand for a waveguide structure to which Al-containing materials are applicable, and which has a diffraction grating offering a wider design freedom in terms of the coupling efficiency and a wider manufacture freedom.

SUMMARY OF THE INVENTION

Accordingly, it is an object of the present invention to realize a waveguide structure to which Al-containing materials are applicable, and which has a diffraction grating offering a wider design freedom in terms of the coupling efficiency and a wider manufacture freedom, thereby providing a dynamic single-mode semiconductor laser device easily with higher reproducibility, yield and reliability.

It is another object of the present invention to provide a semiconductor laser module capable of being easily and efficiently connected to an optical fiber amplifier, an optical fiber laser and the like having an optical fiber as a main component, and a rare-earth-element-doped optical fiber amplifier and a fiber laser capable of contributing to high-speed long-haul optical communication.

The invention provides a semiconductor laser device comprising:
an active layer;
upper and lower waveguide layers sandwiching the active layer therebetween;
upper and lower cladding layers sandwiching the active layer and the upper and lower waveguide layers therebetween; and
a current narrowing structure defining a current-injection region for injecting current to the active layer,
wherein a diffraction grating having a periodical structure in a resonance cavity direction is buried in any one of the waveguide layers, and the waveguide layer in which the diffraction grating is buried and the cladding layer adjoining to that waveguide layer forms an interface which is substantially flat in the resonance cavity direction.

According to the invention, as described above, the guided mode propagating within the waveguide structure based on a stepped refractive index profile is of a configuration such as to have peaks within the waveguide layers having a higher refractive index. As a result, the guided mode has a relatively gentle intensity distribution within the waveguide layers. By burying the diffraction grating within one of the waveguide layers it becomes possible to relax the limitations on the positioning precision of the diffraction grating thereby expanding allowances in design and manufacture. In addition, since buried diffraction gratings have an advantage that such parameters as the thickness of the diffraction grating layer and the distance from the center of the waveguide structure can be designed completely independently of the waveguide structure, it is possible to secure a widened design freedom.

In the fabrication of a semiconductor laser device, the growth of a crystal proceeds in a direction perpendicular to a surface of the crystal. Accordingly, if, for example, in the case where asperities having an inclined face are formed on the surface of the crystal, the crystal is grown retaining the asperities, the crystal growth directions of adjacent inclined faces would intersect each other and, hence, the growing surfaces of the crystal would collide with each other. As a result, crystalline defects are likely to be accumulated at a location where the adjacent inclined faces contact each other, especially at the bottom of dips. When such crystalline defects are accumulated in the waveguide layer, problems such as optical absorption loss are raised, so that the oscillation characteristics and reliability of the device are affected. For this reason, the present invention provides the feature that the waveguide layer in which the diffraction grating is buried and the cladding layer adjoining to that waveguide layer forms an interface which is substantially flat in the resonance cavity direction, so as to make the crystal growing surface flat in the process of burying the unevenness thereby avoiding the accumulation of crystalline defects. This makes it possible to enhance the oscillation characteristics and reliability of the device.

In the semiconductor laser device of the invention, it is preferable that the diffraction grating is buried within the upper waveguide layer and is present in at least a part of the current-injection region.

According to the invention, the provision of the diffraction grating within the upper waveguide layer minimizes the influence of the grating configuration on the configuration and characteristics of the active layer. More specifically, where the diffraction grating is buried within the lower waveguide layer, the active layer is positioned above the diffraction grating. In this case, it is possible that any transformation or defect of the crystalline structure that may occur in the crystal re-growth on the uneven surface affects the active layer. By locating the diffraction grating above the active layer, such a possible disadvantage can be avoided and, hence, a decrease in luminous efficiency can be avoided.

In the process of burying the unevenness formed on the structure surface, the surface configuration gradually becomes substantially flat with crystal growth. In the case of a device structure in which the interface between the waveguide layer in which the diffraction grating is buried and the cladding layer adjoining thereto is not flat in the resonance cavity direction, it is very difficult to make up the micro-configuration of the interface influencing the waveguide in conformity with the design. In contrast, the device structure in which the interface is flat in the resonance cavity direction, it is easy c to make up the interface configuration in conformity with the design.

The carrier density distribution in the active layer grows high in the current injection region, and therefore, the light intensity also grows high in the current injection region. For this reason, the feature of the invention that the diffraction grating is present in at least a part of the current injection region enhances the light-grating coupling efficiency and hence improves the stability of the longitudinal mode.

In the semiconductor laser device of the invention, it is preferable that the device oscillates in a transverse multi mode.

According to the invention, since the device is of a transverse-multimode waveguide structure in which a plurality of transverse modes are distributed in a horizontal direction which is perpendicular to the resonance cavity direction and parallel with the active layer, a higher output can be attained. In addition, a diffraction grating is formed in the current injection region, which enhances the coupling efficiency between the diffraction grating which is present in the current injection region and each transverse mode. The coupling efficiency is further enhanced by the provision of the diffraction grating buried within the waveguide layer. Thus, a higher-output, single longitudinal mode oscillation will result. It should be noted that the transverse-multimode waveguide structure in the current injection region may be constructed of an index guiding structure having a wide horizontal width or a large index difference between the inside and the outside of the current injection region, or a gain guiding structure.

In the semiconductor laser device of the invention, it is preferable that the current narrowing structure is located farther than the interface between the cladding layer and the waveguide layer from the active layer.

According to the invention, by locating the current narrowing structure farther than the cladding layer/waveguide layer interface from the active layer, especially in a region outside the waveguide layer, the guided mode is less influenced by the current narrowing structure, and the resultant device is of a gain guiding structure. With the gain guiding-type transverse-multimode waveguide structure, the diffraction grating substantially coincides due to a small difference in effective index between the transverse modes. Accordingly, the oscillation spectrum of the overall device resulting from superposition of all the transverse modes is narrow, and thus, a substantially single wavelength can be selected.

The current narrowing structure can be formed by any ordinary process usually used in the fabrication of semiconductor laser devices such as a semiconductor layer burying process or an ion implantation process to provide a semiconductor layer having a higher resistance. Examples of such processes include confinement of the current injection region using a striped electrode structure or a dielectric film pattern.

The width, defined by the current narrowing structure, of the current injection region is preferably 10 $\mu$m or more. This feature allows the gain guiding-type transverse-multimode waveguide structure to be realized readily.

In the semiconductor laser device of the invention, it is preferable that a confinement factor of a guided mode confined within a waveguide region as a total of the waveguide layer and the active layer is 0.8 or more.

According to the invention, by increasing the confinement factor of the guided mode confined within the waveguide region as the total of the waveguide layer and the active layer to 0.8 or greater, the overlap between the guided mode and the diffraction grating can be expanded thereby enlarging the design range of the coupling efficiency. In addition, since buried diffraction gratings have an advantage that such parameters as the thickness of the diffraction grating layer and the distance from the center of the waveguide structure can be designed completely independently of the waveguide structure, it is possible to secure a wider design freedom. Note that the confinement factor of a guided mode can be calculated using an analyzing method for multi-layered slab waveguide structures (see Kenji Kono, "Fundamentals and Applications of Optical Coupling Systems for Optical Devices", pp. 152–161, GENDAIKOGAKUSHA, 1998).

The waveguide layer in which the diffraction grating is buried is preferably formed of a semiconductor material free of Al. Examples of such preferable materials include GaAs, InGaAsP and InGaP.

It is preferred that a crystal re-growth interface protective layer which is an Al-free semiconductor layer adjoining to the diffraction grating be provided on the substrate side of the diffraction grating and be buried within the waveguide layer together with the diffraction grating. Preferred examples of such semiconductor materials include GaAs, InGaAsP and InGaP.

Even in the case where an Al-containing material is used for the cladding layers having a lower refractive index, the use of an Al-free material such as GaAs for the waveguide layers having a higher refractive index enables the structure surface oxidized during the diffraction grating forming process to be cleaned prior to the crystal re-growth. For this reason, the crystal quality of a portion adjacent the crystal re-growth interface can be kept satisfactory thereby ensuring the resultant device enjoying an improved reliability.

Even in the case where Al-containing materials are used for both the cladding layers and the waveguide layers, insertion of the crystal re-growth interface protective layer of an Al-free material leads to advantages as above. In the case of the crystal re-growth interface protective layer of GaAs, InGaAsP or InGaP, the refractive index of the protective layer can be adjusted to a value substantially equal to that of the waveguide layers, thereby minimizing the influence on the guided mode sufficiently.

In the semiconductor laser device of the invention, it is preferable that a carrier blocking layer is interposed between the active layer and either of the upper and lower waveguide layers, the carrier blocking layer having a band gap larger than that waveguide layer.

According to the invention, the provision of the carrier blocking layer having a larger band gap between the waveguide layer and the active layer enables the carrier blocking layer adjacent the active layer to prevent injected carriers from flowing into any layer having an opposite conductivity type, thereby realizing a more efficient oscillation. Further, since either an electron or a hole is solely present within the waveguide layer, it is possible to assuredly inhibit carrier recombination affecting the laser characteristics and reliability even though the waveguide layer is directly processed for crystal re-growth in order to bury the diffraction grating. This facilitates the burying of the diffraction grating in the waveguide layer at a location near the current injection path and the active layer. Further, since the guided mode is loosely confined within the thick waveguide layer, the optical intensity can be lowered in the active layer thereby enabling a higher output operation. Additionally, the guided mode is expanded to enable compatibility between a favorable radiation pattern and a lower radiation angle, while at the same time the positional allowance of the diffraction grating is expanded to widen the design freedom and the manufacture freedom.

The carrier blocking layer has a thickness such as to inhibit the outflow of carriers of an opposite conductivity type satisfactorily and not to disturb the guided mode. Specifically, the thickness of the carrier blocking layer is desirably 5 to 50 nm.

In the present invention, the diffraction grating comprises stripes extending perpendicular to the resonance cavity in a plane parallel with the substrate and aligned periodically in the resonance cavity direction. In a sectional view taken along the resonance cavity direction, each stripe may be quadrangular or triangular in configuration. Further, the diffraction grating layer of the striped configuration is preferably formed of an Al-free material in terms of protection against deterioration due to oxidation during the processing thereof.

Further, the diffraction grating may be located to form either a distributed feedback (DFB) semiconductor laser device or a distributed bragg reflector (DBR) semiconductor laser device.

The invention provides a semiconductor laser module comprising:
 a semiconductor laser device as recited above;
 an optical fiber receiving laser light from the semiconductor laser device; and
 a holder securing the semiconductor laser device and a laser light introducing portion of the optical fiber.

According to the invention, since the use of the higher-output, single-mode oscillation semiconductor laser device makes it possible to transmit higher-output, single wavelength laser light through optical fibers, the semiconductor laser device is easily connected to an optical fiber amplifier or optical fiber laser with the result that enhancement and stabilization of outputs from these apparatuses can be realized.

The invention provides a rare-earth-element-doped fiber amplifier comprising: an optical fiber doped with a rare earth element, and any one of the above-mentioned semiconductor laser devices for use as a rare-earth-element pumping source.

According to the present invention, the use of the above semiconductor laser module in the rare-earth-element-doped fiber amplifier enables excitation at higher output and, in addition, fixes the pumped wavelength thereby ensuring stabilized amplified outputs.

The invention provides a fiber laser doped with a rare earth element, comprising any one of the above-mentioned semiconductor laser devices as an excitation light source.

According to the invention, the use of the semiconductor laser module in a fiber laser which is preferable for high-density wavelength division multiplex (DWDM) in optical communication systems makes it possible to pump in higher output, and additionally because the excitation wavelength is fixed, stabilized outputs can be obtained.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1A:
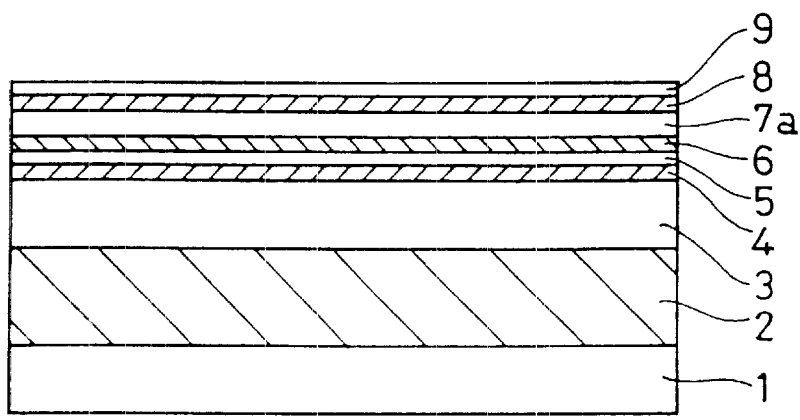
FIGS. 1A to 1C are each a sectional view, taken along the resonance cavity direction, of a first embodiment of the present invention.

Now referring to the drawings, preferred embodiments of the invention are described below.

Figure 1B:
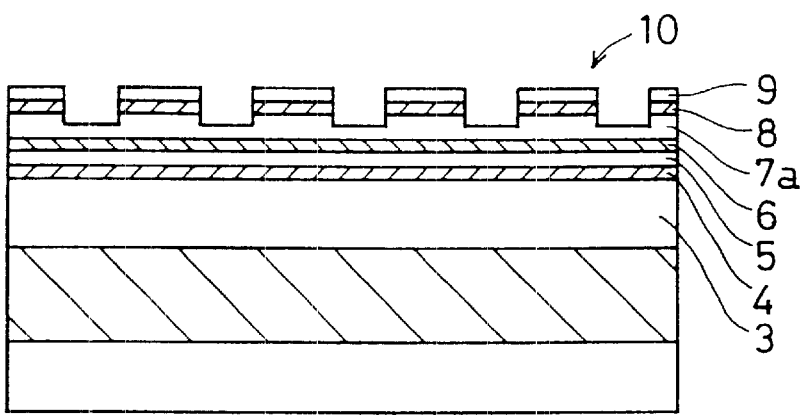
Figure 1C:
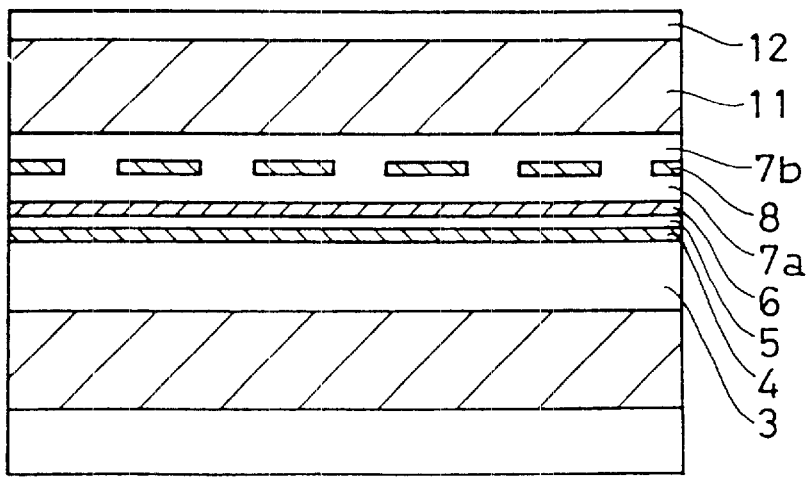
Figure 3:
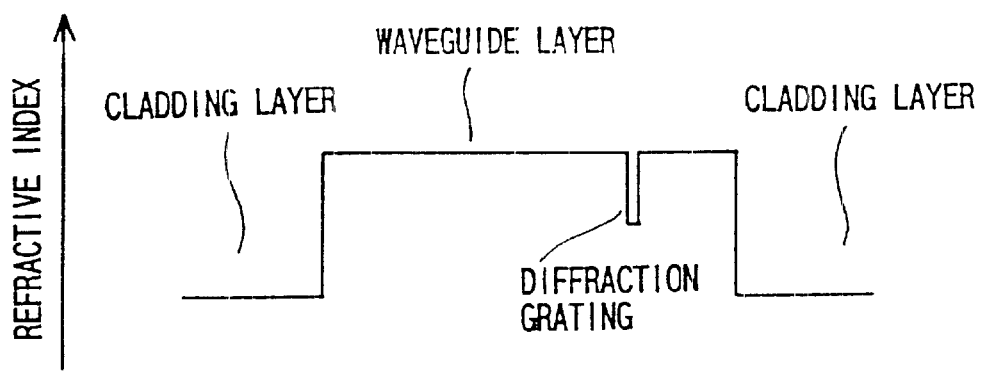
FIG. 3 is a schematic diagram showing a refractive index profile of a vertical waveguide structure of the first embodiment.

The first embodiment of the present invention, including a manufacturing process up to relevant steps, is shown in section along the resonance cavity direction in FIGS. 1A to 1C. Also, the refractive index profile of a vertical waveguide structure of the first embodiment is shown in schematic diagram in FIG. 3. On a substrate 1 of n-GaAs are sequentially formed a 1.5 $\mu$m-thick lower cladding layer 2 of n-Al$_{0.15}$Ga$_{0.85}$As, a 0.5 $\mu$m-thick lower waveguide layer 3 of n-GaAs, a 0.04 $\mu$m-thick carrier blocking layer 4 of n-Al$_{0.4}$Ga$_{0.6}$As, a multi-quantum-well active layer 5 of InGaAs/AlGaAs, a 0.04 $\mu$m-thick carrier blocking layer 6 of p-Al$_{0.4}$Ga$_{0.6}$As, a 0.4 $\mu$m-thick upper waveguide layer 7a of p-GaAs, a 0.015 $\mu$m-thick diffraction grating layer 8 of p-Al$_{0.2}$Ga$_{0.8}$As, and a 0.01 $\mu$m-thick cap layer 9 of p-GaAs (see FIG. 1A).

Using a two-beam holographic lithography process and a wet etching process, trenches are formed having a depth reaching the upper waveguide layer 7a to form a diffraction grating 10 comprising a plurality of stripes oriented perpendicular to a resonance cavity and periodically aligned with a period of about 0.28 $\mu$m in the resonance cavity direction (see FIG. 1B). This period serves as a second-order diffraction grating with respect to oscillation of 0.98 $\mu$m wavelength.

On the resultant structure are sequentially formed a 0.1 $\mu$m-thick upper waveguide layer 7b of p-GaAs, a 1.5 $\mu$m-thick upper cladding layer 11 of p-Al$_{0.15}$Ga$_{0.85}$As, a contact layer 12 of p-GaAs is formed (see FIG. 1C). Ohmic electrode layers are then formed on the upper side of the contact layer 12 and the underside of the substrate 1, respectively. Opposite end faces of the device are each formed with a reflecting facet of the resonance cavity by cleavage or a like process and then coated with a reflectivity controlling film and the like.

This structure provides a single longitudinal mode semiconductor laser device generating oscillation of 980 nm wavelength.

Figure 2A:
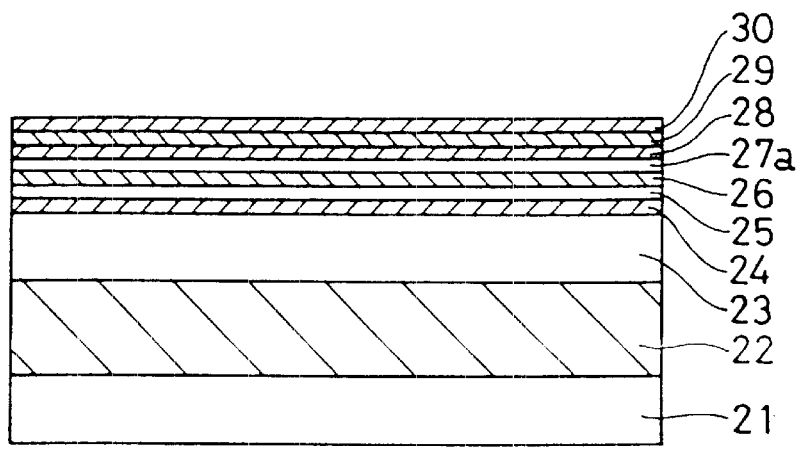
FIGS. 2A to 2C are each a sectional view, taken along the resonance cavity direction, of a second embodiment.
Figure 2B:
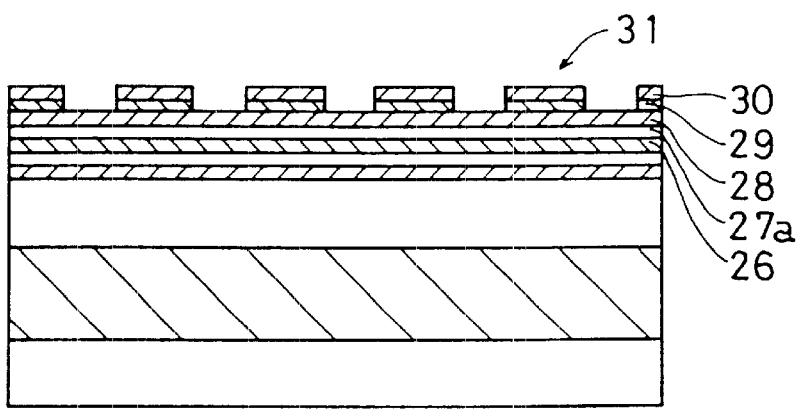
Figure 2C:
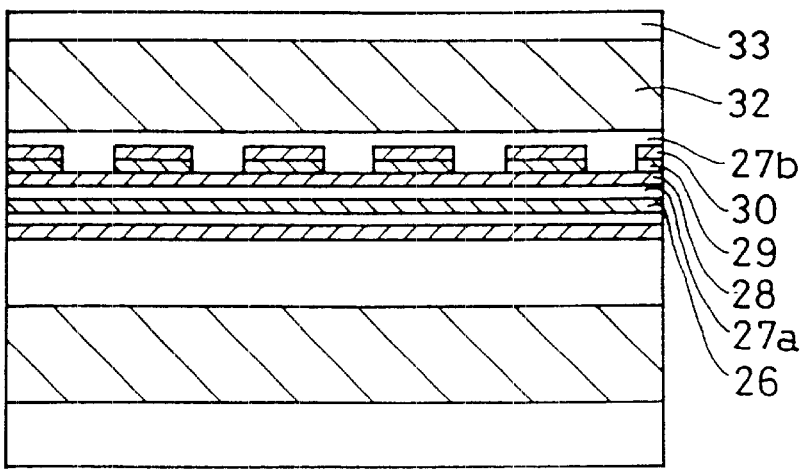
Figure 4:
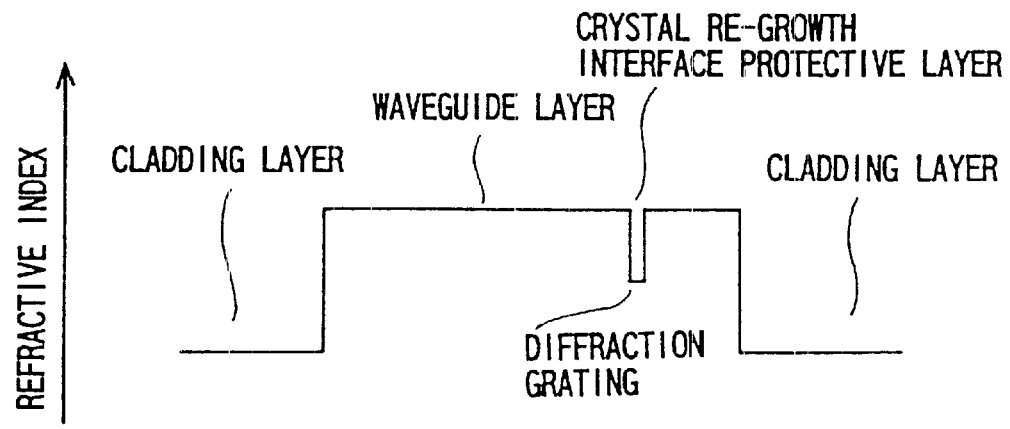
FIG. 4 is a schematic diagram showing a refractive index profile of a vertical waveguide structure of the second embodiment.

Next, the second embodiment of the present invention, including a manufacturing process up to relevant steps, is shown in section along the resonance cavity direction in FIGS. 2A to 2C. Also, the refractive index profile of a vertical waveguide structure of the second embodiment is shown in schematic diagram in FIG. 4. On a substrate 21 of n-GaAs are sequentially formed a 1.5 $\mu$m-thick lower cladding layer 22 of n-$Al_{0.22}Ga_{0.78}As$, a 1.0 $\mu$m-thick lower waveguide layer 23 of n-$Al_{0.18}Ga_{0.82}As$, a 0.02 $\mu$m-thick carrier blocking layer 24 of n-$Al_{0.5}Ga_{0.5}As$, a multi-quantum-well active layer 25 of GaAs/AlGaAs, a 0.02 $\mu$m-thick carrier blocking layer 26 of p-$Al_{0.5}Ga_{0.5}As$, a 0.8 $\mu$m-thick upper waveguide layer 27a of p-$Al_{0.18}Ga_{0.82}As$, a 0.01 $\mu$m-thick crystal re-growth interface protective layer 28 of p-$In_{0.1}Ga_{0.9}As_{0.8}P_{0.2}$, a 0.015 $\mu$m-thick diffraction grating layer 29 of p-$Al_{0.4}Ga_{0.6}As$, and a 0.01 $\mu$m-thick cap layer 30 of p-$In_{0.1}Ga_{0.9}As_{0.8}P_{0.2}$ (see FIG. 2A).

Using a two-beam holographic lithography process and a wet etching process, trenches are formed having a depth reaching the crystal re-growth interface protective layer 28 to form a diffraction grating 31 comprising a plurality of stripes oriented perpendicular to a resonance cavity and periodically aligned with a period of about 0.26 $\mu$m in the resonance cavity direction (see FIG. 2B). This period serves as a second-order diffraction grating with respect to oscillation of 0.86 $\mu$m wavelength.

On the resultant structure are sequentially formed a 0.2 $\mu$m-thick upper waveguide layer 27b of p-$Al_{0.18}Ga_{0.82}As$, a 1.5 $\mu$m-thick upper cladding layer 32 of p-$Al_{0.22}Ga_{0.78}As$, and a contact layer 33 of p-GaAs (see FIG. 2C). Ohmic electrode layers are then formed on the upper side of the contact layer 33 and the underside of the substrate 21, respectively. Opposite end faces of the device are each formed with a reflecting facet of the resonance cavity by cleavage or a like process and then coated with a reflectivity controlling film and the like.

This structure provides a single longitudinal mode semiconductor laser device generating oscillation of 860 nm wavelength.

Figure 5A:
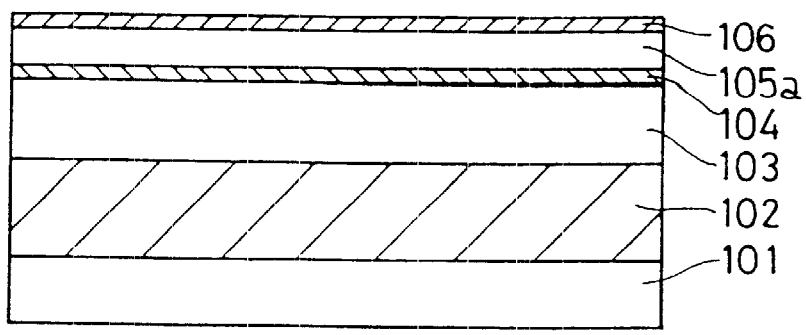
FIGS. 5A to 5C are each a sectional view, taken along the resonance cavity direction, of a third embodiment.
Figure 5B:
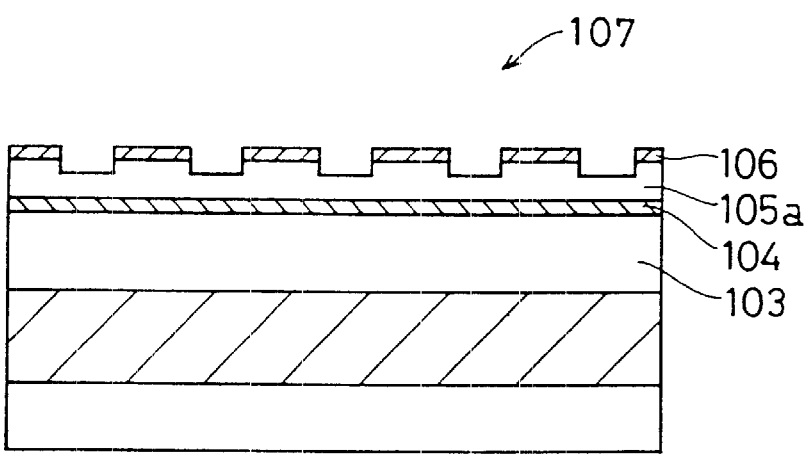
Figure 5C:
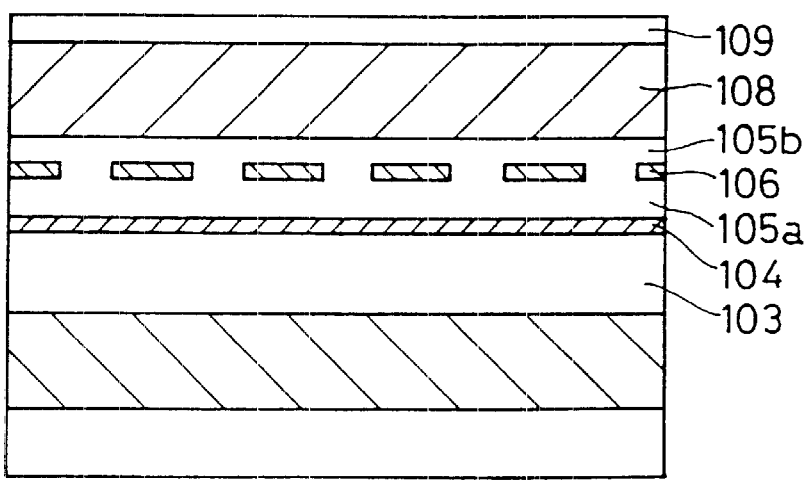
Figure 7:
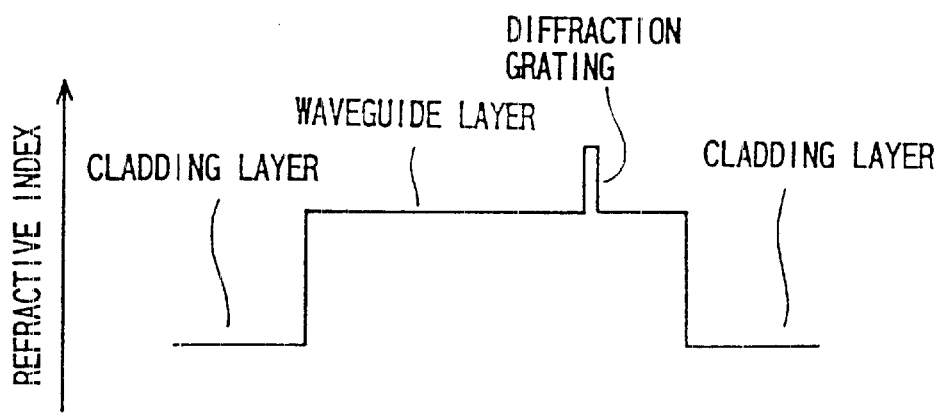
FIG. 7 is a schematic diagram showing a refractive index profile of a vertical waveguide structure of the third embodiment.

In turn, the third embodiment of the present invention, including a manufacturing process up to relevant steps, is shown in section along the resonance cavity direction in FIGS. 5A to 5C. Also, the refractive index profile of a vertical waveguide structure of the third embodiment is shown in schematic diagram in FIG. 7. On a substrate 101 of n-GaAs are sequentially formed a lower cladding layer 102 of n-$Al_{0.2}Ga_{0.4}In_{0.4}P$, a 0.3 $\mu$m-thick lower waveguide layer 103 of n-$In_{0.5}Ga_{0.5}P$, a multi-quantum-well active layer 104 of InGaAs/InGaAsP, a 0.25 $\mu$m-thick upper waveguide layer 105a of $In_{0.5}Ga_{0.5}P$, and a 0.02 $\mu$m-thick diffraction grating layer 106 of GaAs (see FIG. 5A).

Using an holographic lithography process and a wet etching process, trenches are formed having a depth reaching the upper waveguide layer 105a to form a diffraction grating 107 comprising a plurality of stripes oriented perpendicular to a resonance cavity and periodically aligned with a period of about 0.29 $\mu$m in the resonance cavity direction (see FIG. 5B). This period serves as a second-order diffraction grating with respect to oscillation of 0.94 $\mu$m wavelength.

On the resultant structure are sequentially formed a 0.05 $\mu$m-thick upper waveguide layer 105b of $In_{0.5}Ga_{0.5}P$, an upper cladding layer 108 of p-$Al_{0.2}Ga_{0.4}In_{0.4}P$, and a contact layer 109 of p-GaAs (see FIG. 5C). Ohmic electrode layers are then formed on the upper side of the contact layer 109 and the underside of the substrate 101, respectively. Opposite end faces of the device are each formed with a reflecting facet of the resonance cavity by cleavage or a like process and then coated with a reflectivity controlling film and the like.

This structure provides a single longitudinal mode semiconductor laser device generating oscillation of 940 nm wavelength.

This device exhibits a confinement factor of 0.8 or greater with which the guided mode is confined within the waveguide region as the total of the lower waveguide layer 103, upper waveguide layers 105a and 105b and active layer 104. Thus, it is possible to expand the overlap between the diffraction grating and the guided mode.

Figure 6A:
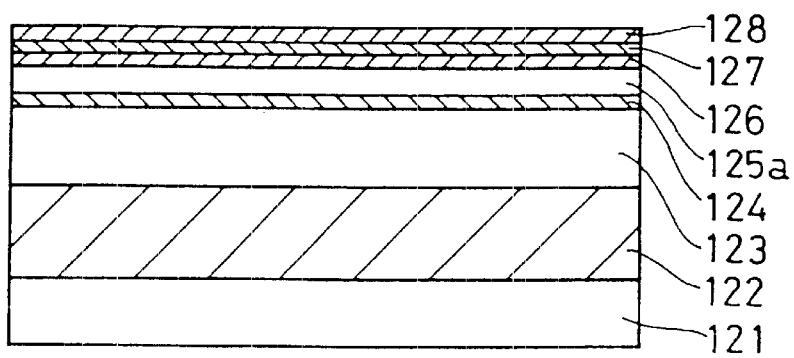
FIGS. 6A to 6C are each a sectional view, taken along the resonance cavity direction, of a fourth embodiment.
Figure 6B:
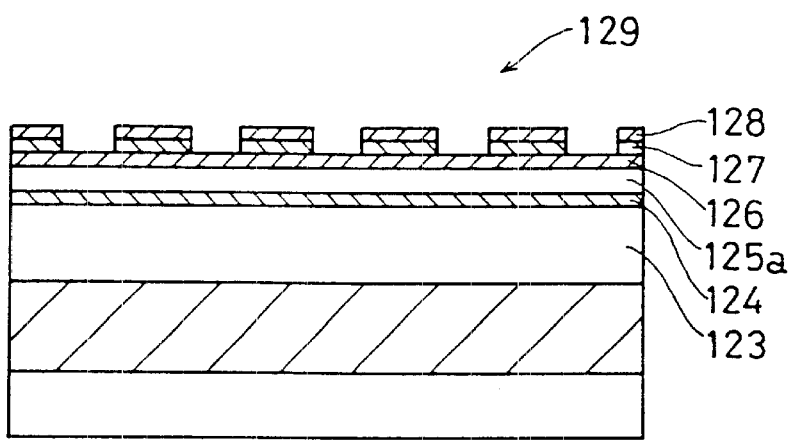
Figure 6C:
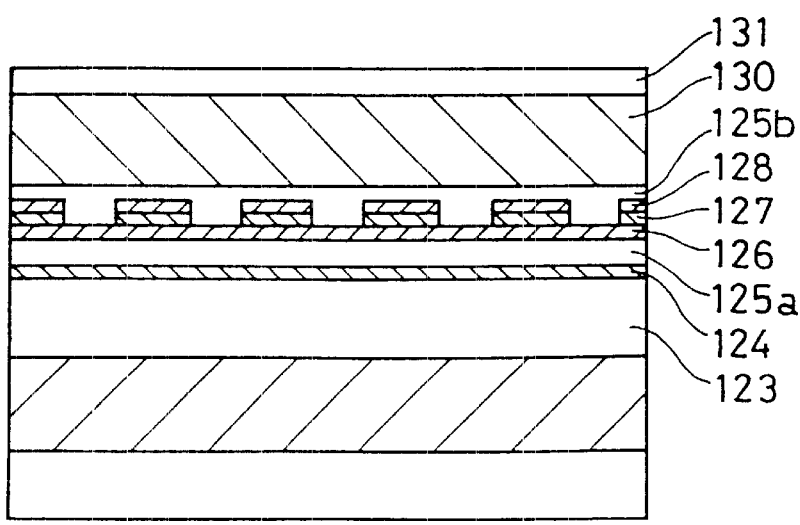
Figure 8:
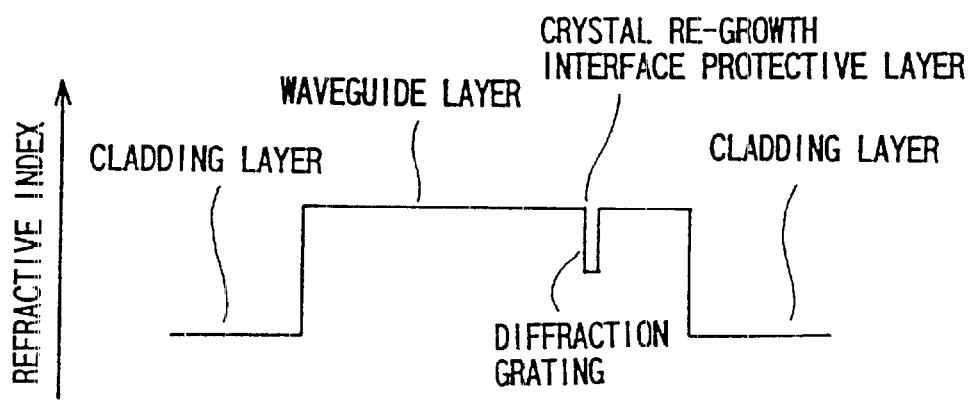
FIG. 8 is a schematic diagram showing a refractive index profile of a vertical waveguide structure of the fourth embodiment.

In turn, the fourth embodiment of the present invention, including a manufacturing process up to relevant steps, is shown in section along the resonance cavity direction in FIGS. 6A to 6C. Also, the refractive index profile of a vertical waveguide structure of the fourth embodiment is shown in schematic diagram in FIG. 8. On a substrate 121 of n-GaAs are sequentially formed a lower cladding layer 122 of n-$Al_{0.6}Ga_{0.4}As$, a 0.3 $\mu$m-thick lower waveguide layer 123 of n-$Al_{0.3}Ga_{0.7}As$, a multi-quantum-well active layer 124 of GaAs/AlGaAs, a 0.25 $\mu$m-thick upper waveguide layer 125a of p-$Al_{0.3}Ga_{0.7}As$, a 0.01 $\mu$m-thick crystal re-growth interface protective layer 126 of p-$In_{0.15}Ga_{0.85}As_{0.7}P_{0.3}$, a 0.02 $\mu$m-thick diffraction grating layer 127 of p-$Al_{0.05}Ga_{0.5}As$, and a 0.01 $\mu$m-thick cap layer 128 of p-$In_{0.15}Ga_{0.85}As_{0.7}P_{0.3}$ (see FIG. 6A) Using an holographic lithography process and a wet etching process, trenches are formed having a depth reaching the crystal re-growth interface protective layer 126 to form a diffraction grating 129 comprising a plurality of stripes oriented perpendicular to a resonance cavity and periodically aligned with a period of about 0.27 $\mu$m in the resonance cavity direction (see FIG. 6B). This period serves as a second-order diffraction grating with respect to oscillation of 0.86 $\mu$m wavelength.

On the resultant structure are sequentially formed a 0.05 $\mu$m-thick upper waveguide layer 125b of p-$Al_{0.3}Ga_{0.7}As$, an upper cladding layer 130 of p-$Al_{0.6}Ga_{0.4}As$, and a contact layer 131 of p-GaAs (see FIG. 6C). Ohmic electrode layers are then formed on the upper side of the contact layer 131 and the underside of the substrate 121, respectively. Opposite end faces of the device are each formed with a reflecting facet of the resonance cavity by cleavage or a like process and then coated with a reflectivity controlling film and the like.

This structure provides a single longitudinal mode semiconductor laser device generating oscillation of 860 nm wavelength.

This device exhibits a confinement factor of 0.8 or greater with which the guided mode is confined within the waveguide region as the total of the lower waveguide layer 123, upper waveguide layers 125a and 125b and active layer 124. Thus, it is possible to expand the overlap between the diffraction grating and the guided mode.

Figure 9A:
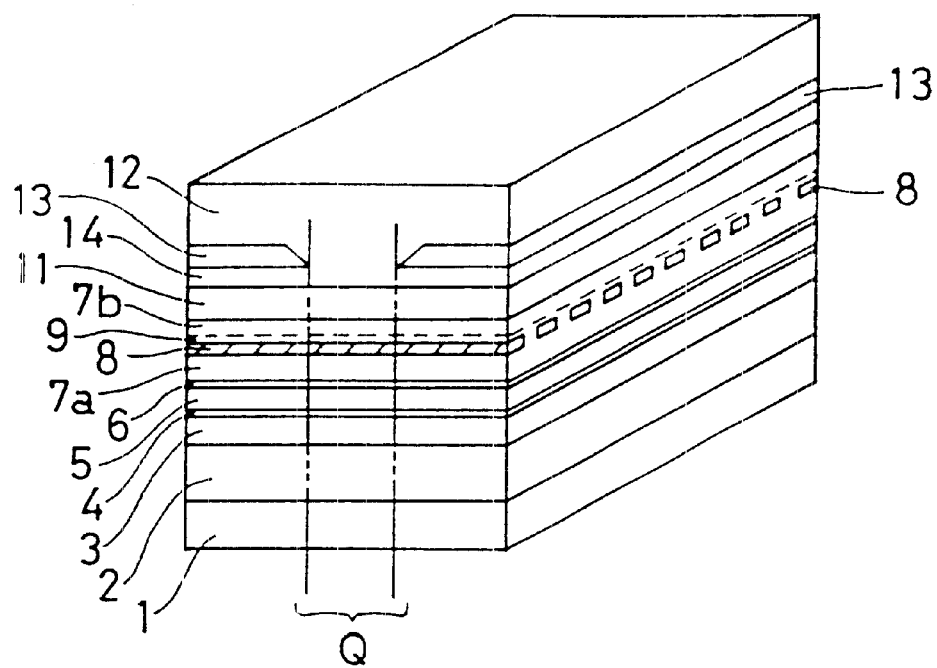
FIGS. 9A and 9B show a fifth embodiment of the present invention, FIG. 9A being a perspective overall view, and FIG. 9B being a fragmentary perspective view illustrating the configuration and location of a diffraction grating.
Figure 9B:
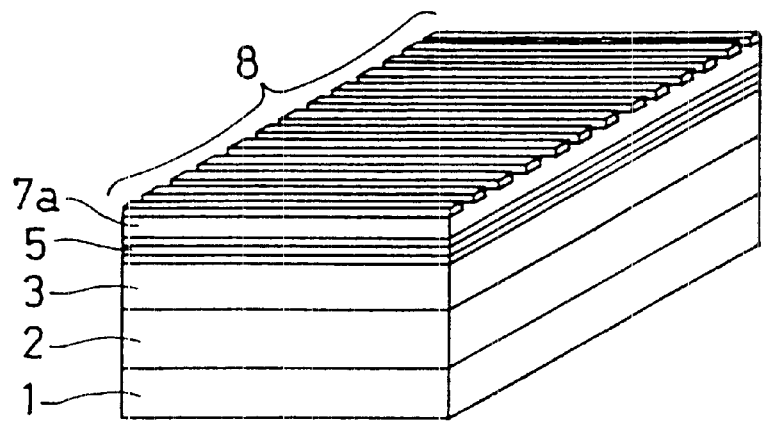

FIGS. 9A and 9B are perspective views showing a fifth embodiment of the present invention. The refractive index profile of a vertical waveguide structure in a current injection region of the fifth embodiment is the same as in FIG. 3. On a substrate 1 of n-GaAs are sequentially formed a 1.5 $\mu$m-thick lower cladding layer 2 of n-$Al_{0.15}Ga_{0.85}As$, a 0.5 $\mu$m-thick lower waveguide layer 3 of n-GaAs, a 0.04 $\mu$m-thick carrier blocking layer 4 of n-$Al_{0.4}Ga_{0.6}As$, a multi-quantum-well active layer 5 of InGaAs/AlGaAs, a 0.04 $\mu$m-thick carrier blocking layer 6 of p-$Al_{0.4}Ga_{0.6}As$, a 0.4 $\mu$m-thick upper waveguide layer 7a of p-GaAs, a 0.015 $\mu$m-thick diffraction grating layer 8 of p-$Al_{0.2}Ga_{0.8}As$, and a 0.01 $\mu$m-thick cap layer 9 of p-GaAs.

Using a two-beam holographic lithography process and a wet etching process, trenches are formed having a depth reaching the upper waveguide layer 7a to form a diffraction grating 10 comprising a plurality of stripes oriented perpendicular to a resonance cavity and periodically aligned with a period of about 0.28 μm in the resonance cavity direction. This period serves as a second-order diffraction grating with respect to oscillation of 0.98 μm wavelength.

On the resultant structure are sequentially formed a 0.1 μm-thick upper waveguide layer 7b of p-GaAs, a 1.5 μm-thick upper cladding layer 11 of p-Al$_{0.15}$Ga$_{0.85}$As, a 0.5 μm-thick buffer layer 14 of p-GaAs, and a 0.3 μm-thick current narrowing layer 13 of n-GaAs. Subsequently, a trench having a depth reaching the buffer layer 14 is formed using typical photolithography process and wet etching process to form a current injection region having a 50 μm-wide current injection window. Further, a contact layer 12 of p-GaAs is formed. Ohmic electrode layers are then formed on the upper side of the contact layer 12 and the underside of the substrate 1, respectively. Opposite end faces of the device are each formed with a reflecting facet of the resonance cavity by cleavage or a like process and then coated with a reflectivity controlling film and the like.

This structure provides a single longitudinal mode semiconductor laser device generating oscillation of 980 nm wavelength.

The configuration and location of diffraction gratings are described below. A current narrowing layer 13 (n-GaAs) having a striped window is buried between the buffer layer 14 above the upper cladding layer 11 and the contact layer 12, to define a current injection region Q for injecting current to an active layer 5. A diffraction grating layer 8 is buried within the upper waveguide layers 7a, the cap layer 9 and the upper waveguide layer 7b which are of the same composition. The diffraction grating extends over the entire width of the device in the transverse direction perpendicular to the resonance direction so as to include the current injection region Q. This feature enhances the light-grating coupling efficiency and further improves the stability of the longitudinal mode.

Herein description is made giving an example in which the respective layers from the substrate to the upper cladding layers of the first embodiment device structure of FIG. 1 are used, however, the layers from the substrate to the upper cladding layer of the device structures of the second through fourth embodiments may be used.

Figure 10A:
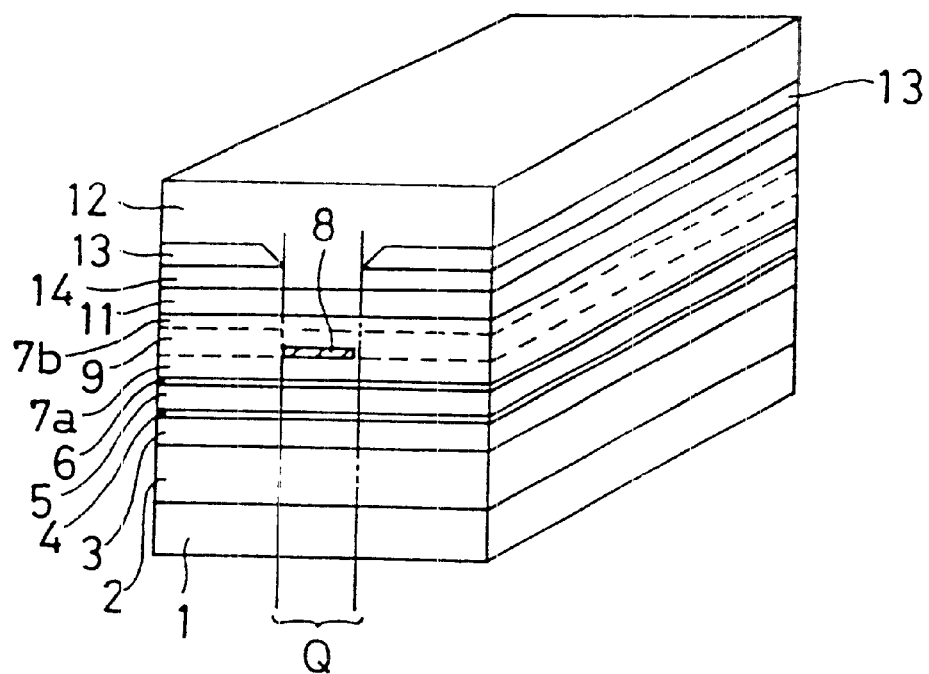
FIGS. 10A and 10B show a sixth embodiment of the present invention, FIG. 10A being a perspective overall view, and FIG. 10B being a fragmentary perspective view illustrating the configuration and location of a diffraction grating.
Figure 10B:
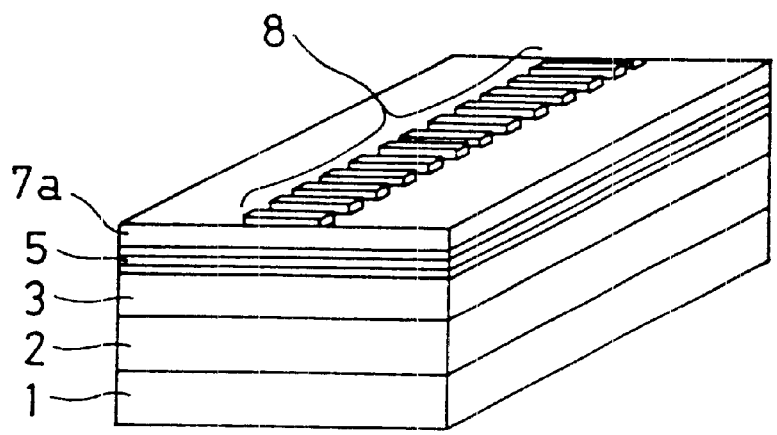

FIGS. 10A and 10B shows the sixth embodiment of the present invention, FIG. 10A being a perspective overall view, and FIG. 10B being a fragmentary perspective view illustrating the configuration and location of the diffraction grating of the sixth embodiment. This is an example in which a current narrowing layer is added to the device structure of the first embodiment as shown in FIG. 1, however, the same is applicable to the device structures of the second through fourth embodiments. The sixth embodiment is identical with the fifth embodiment except that the diffraction grating is formed in only part of the current injection region Q in the transverse direction thereof.

Figure 11A:
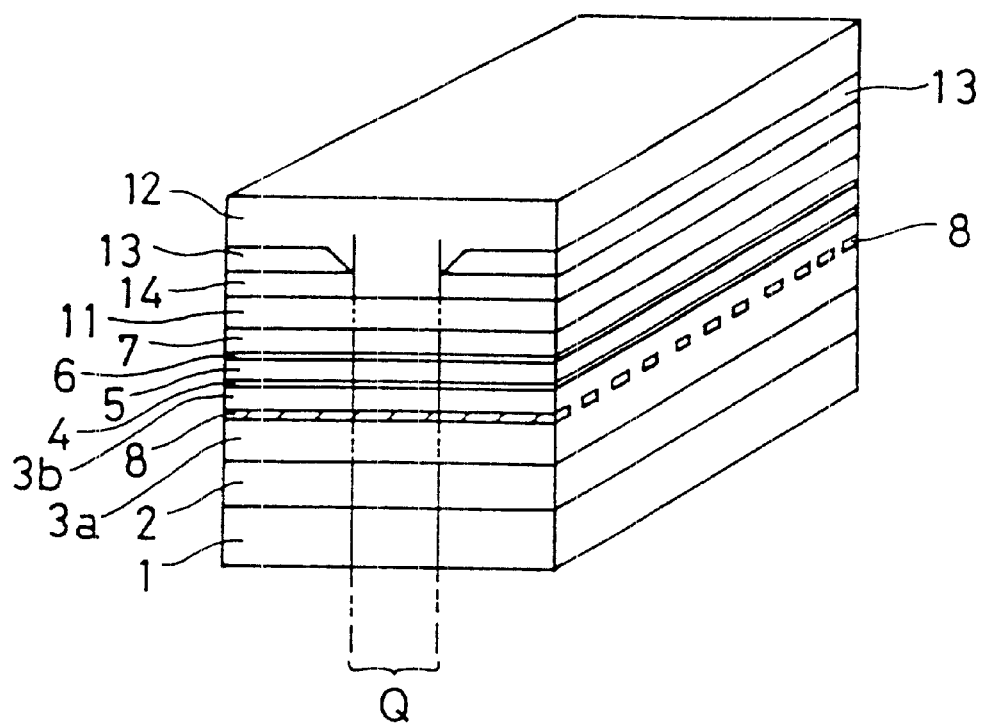
FIGS. 11A and 11B show a seventh embodiment of the present invention, FIG. 11A being a perspective overall view, and FIG. 11B being a fragmentary perspective view illustrating the configuration and location of a diffraction grating.
Figure 11B:
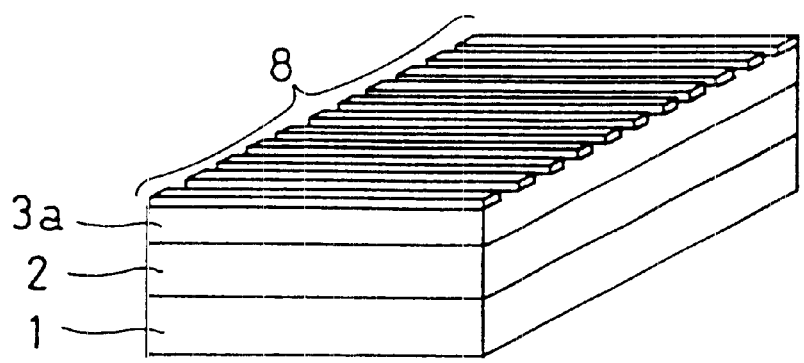

FIGS. 11A and 11B shows the seventh embodiment of the present invention, FIG. 11A being a perspective overall view, and FIG. 11B being a fragmentary perspective view illustrating the configuration and location of the diffraction grating of the seventh embodiment.

In FIG. 11, on the substrate 1 are formed sequentially a lower cladding layer 2, lower waveguide layers 3a, 3b, a carrier blocking layer 4, a multi-quantum-well active layer 5, a carrier blocking layer 6, an upper waveguide layer 7 and an upper cladding layer 11, and the structure from the substrate to the upper cladding layer is the same as that of the first embodiment. In the lower waveguide layers 3a, 3b is buried diffraction grating layer identical with that of the first embodiment. On the upper cladding layer 11 are formed the buffer layer 14 of p-GaAs and contact layer 12, between which the current narrowing layer 13 of n-GaAs is buried.

This is an example of a device structure in which the diffraction grating, which is buried in the upper waveguide layer in the first embodiment as shown in FIG. 1, is disposed in the lower waveguide layer and a current narrowing layer is added, and this structure may be also applied to the device structures of the second through fourth embodiments by making modifications.

Figure 12A:
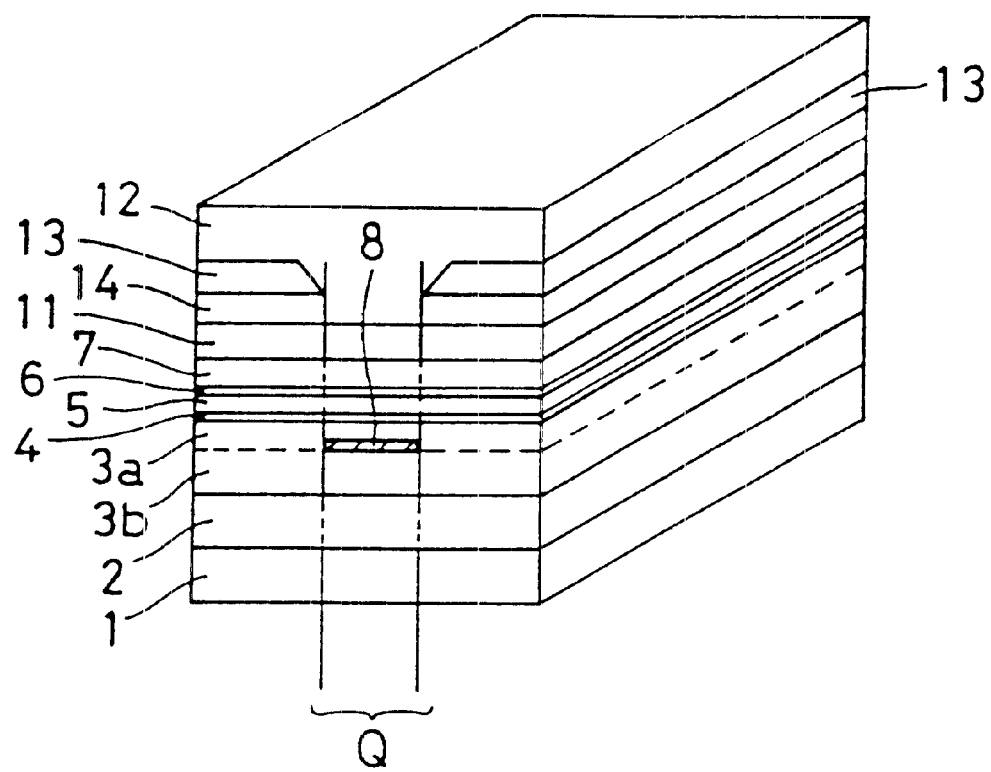
FIGS. 12A and 12B show a eighth embodiment of the present invention, FIG. 12A being a perspective overall view, and FIG. 12B being a fragmentary perspective view illustrating the configuration and location of a diffraction grating.
Figure 12B:
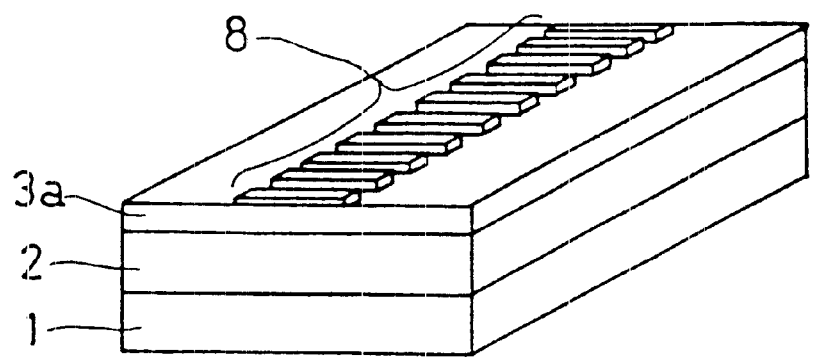

FIGS. 12A and 12B shows the eighth embodiment of the present invention, FIG. 12A being a perspective overall view, and FIG. 12B being a fragmentary perspective view illustrating the configuration and location of the diffraction grating of the eighth embodiment. The eighth embodiment is identical with the seventh embodiment except that the diffraction grating is formed in only part of the current injection region Q in the transverse direction thereof.

In the foregoing embodiments the interfaces with the cladding layer adjacent to the waveguide layer in which the diffraction grating is buried is flat in the resonator direction.

The energy gap of the waveguide layer in which the diffraction grating is buried maybe larger or smaller than that of the diffraction grating layer buried therein, however, it is preferable that the following relationship is satisfied:

active layer<waveguide layer<diffraction grating layer.

It is preferable that the difference in refractive index between the diffraction grating layer and the waveguide layer is larger. Thus, as far as the above relationship is satisfied, flexibility in material design is enhanced regardless of light absorption.

Figure 13:
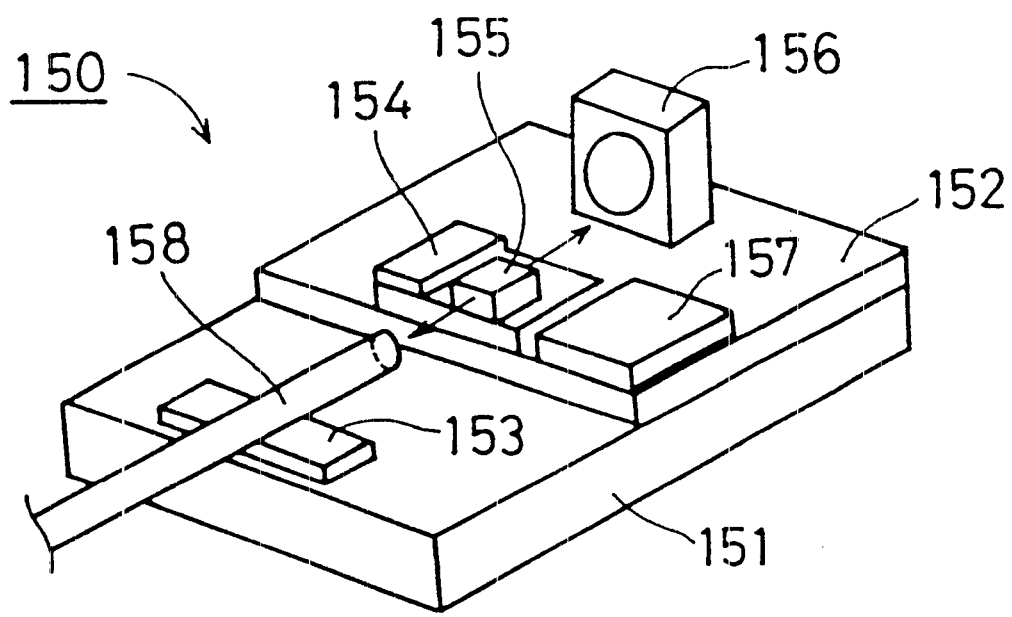
FIG. 13 is a perspective view showing an example of a semiconductor laser module according to the present invention.

FIG. 13 is a perspective view showing an example of a semiconductor laser module according to the present invention. A semiconductor laser module 150 comprises holders 151, 152 and 153, a laser holder 154, a semiconductor laser device 155, a light-receiving element 156, a temperature sensor 157, an optical fiber 158, and the like.

The semiconductor laser device 155 is secured to the holder 152 via the laser holder 154. The temperature sensor 157 for monitoring the temperature is mounted on the holder 152. The holder 153 fixes a light introducing portion of the optical fiber 158. The holders 152 and 153 are secured to the holder 151.

The semiconductor laser device 155 radiates laser light forwardly and rearwardly in the resonance cavity direction. Forwardly radiated laser light enters the optical fiber 158 for optical communication, while on the other hand rearwardly radiated laser light becomes incident on the light receiving element 156 monitoring the optical output.

Any one of the higher-output, single-wavelength semiconductor laser devices according to the first to eighth embodiments can be used as the semiconductor laser device 155. The use of the higher-output, single-mode oscillation semiconductor laser device makes it possible to transmit higher-output, single wavelength laser light through optical fibers, the laser light is easily coupled to an optical fiber amplifier or optical fiber laser with the result that enhancement and stabilization of outputs from these apparatuses can be realized.

Figure 14:
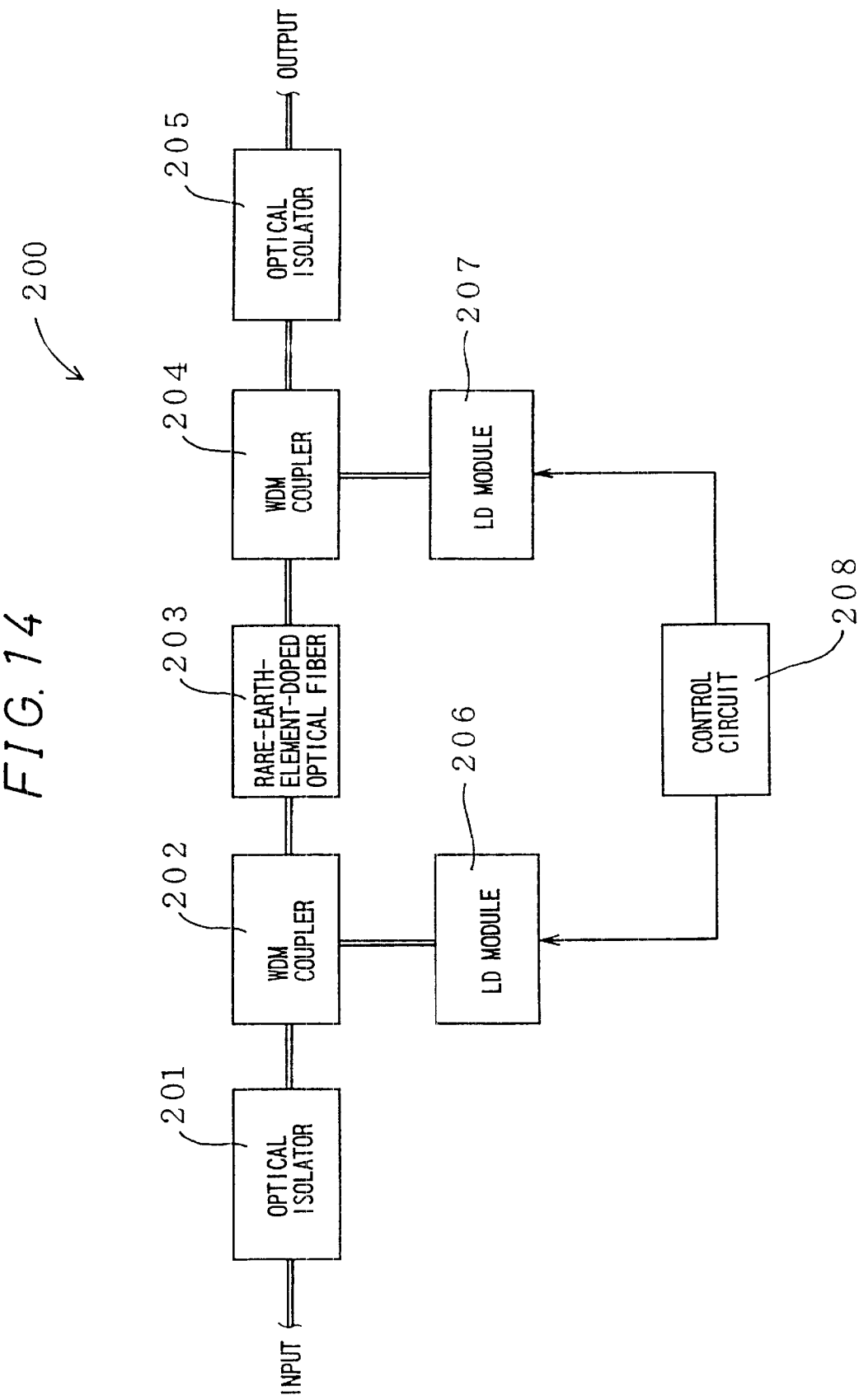
FIG. 14 is a block diagram showing an example of an rare-earth-element-doped fiber amplifier according to the present invention.

FIG. 14 is a block diagram showing an example of a rare-earth-element-doped fiber amplifier. A rare-earth-element-doped fiber amplifier 200 comprises an optical isolator 201, a wavelength division multiplexing (WDM) coupler 202, a rare-earth-element-doped optical fiber 203, a WDM coupler 204 and an optical isolator 205 which are serially connected one to another through optical fibers. The amplifier further comprises semiconductor laser modules 206 and 207 for supplying pumped light power to the WDM couplers 202 and 204, respectively, and a control circuit 208 for controlling the operations of the semiconductor laser modules 206 and 207.

Recently, the traffic capacity required for optical communication systems has steeply increased. WDM optical communication systems can accommodate such an increase in traffic by increasing the degree of multiplexing (the number of wavelength channels). Such higher-capacity optical systems are called "Dense WDM (DWDM) systems". WDM optical communication systems feature that signals in a plurality of wavelength channels are collectively amplified by the use of an Er-doped fiber amplifier (EDFA). A semiconductor laser device (module) to be used as a light source for pumping the EDFA is required to output substantially in proportion to the degree of multiplexing. An conventional EDFA employs a single transverse mode semiconductor laser device (not having a wavelength control function). In contrast, the EDFA of the present invention employing a transverse-multimode DFB semiconductor laser device according to a preferred embodiment of the invention enjoys the following advantages: a) capable of excitation at a higher output; b) more stabilized EDFA output by virtue of a fixed pumping wavelength; and like advantages. Such an EDFA may employ an Er-doped fiber of either the single cladding type or the double cladding type. The EDFA employing a double cladding type Er-doped fiber is more advantageous because efficient amplification is realized even if the mode diameter of the pumping light source (i.e., the fiber diameter of the semiconductor laser module for excitation) is larger.

Figure 15:
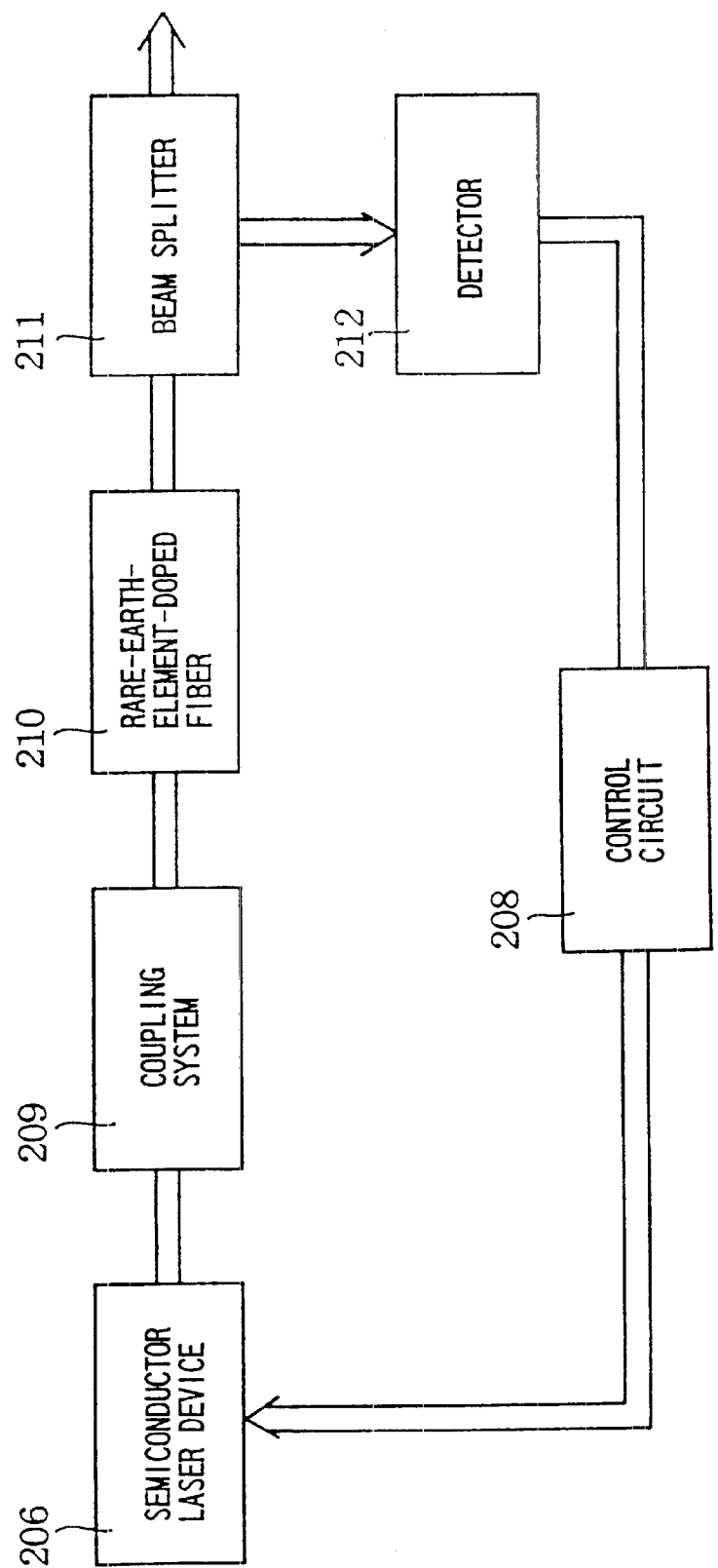
FIG. 15 is a block diagram showing an example of a fiber laser according to the invention.
Figure 16:
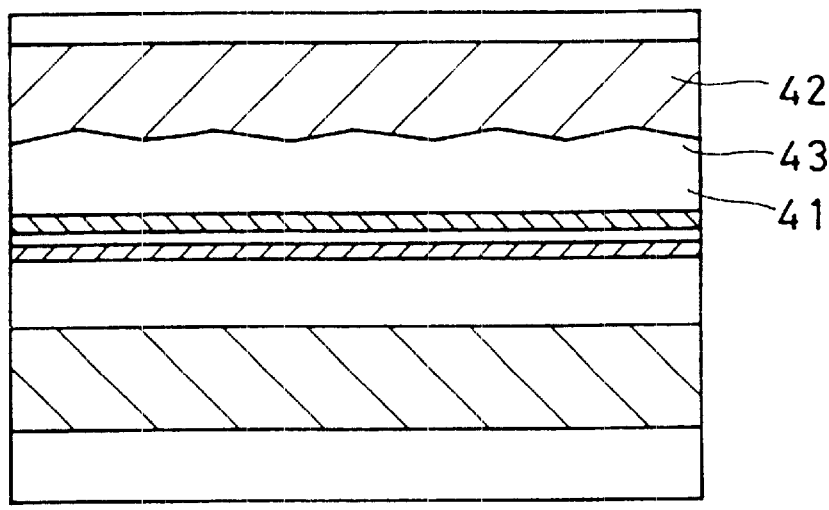
FIG. 16 is a sectional view, taken along the resonance cavity direction, of a first prior art technology.
Figure 17:
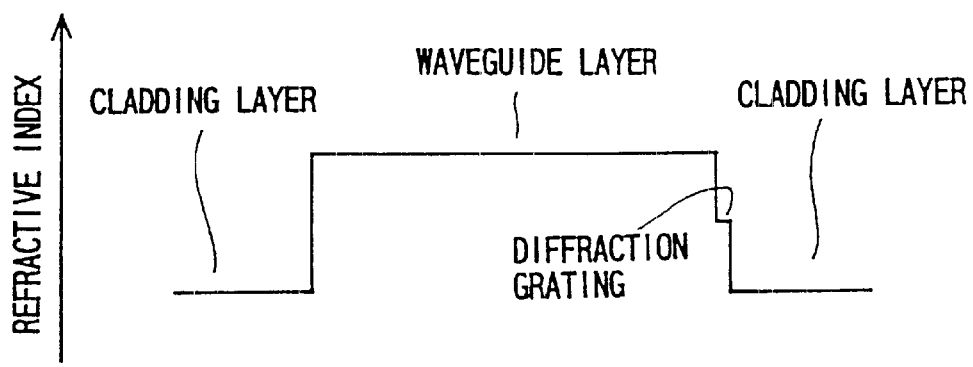
FIG. 17 is a schematic diagram showing a refractive index profile of a vertical waveguide structure of the first prior art technology.
Figure 18:
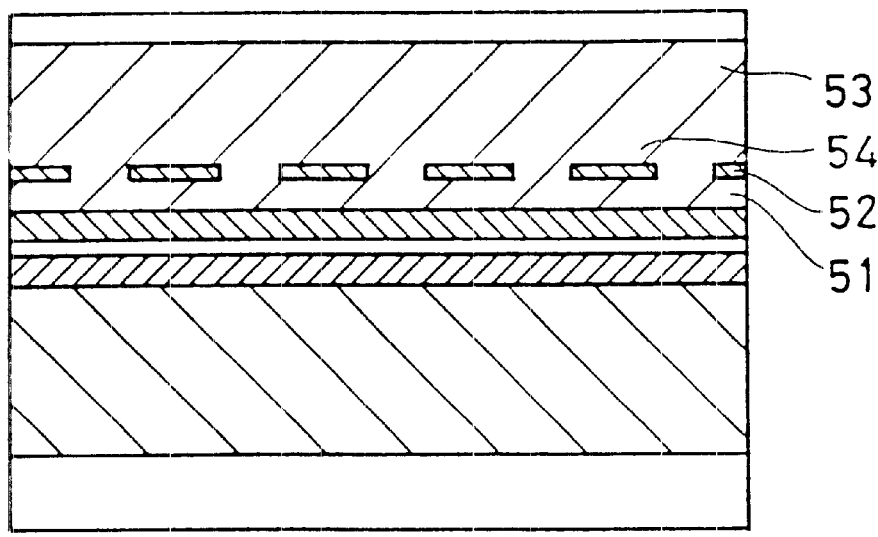
FIG. 18 is a sectional view, taken along the resonance cavity direction, of a second prior art technology.
Figure 19:
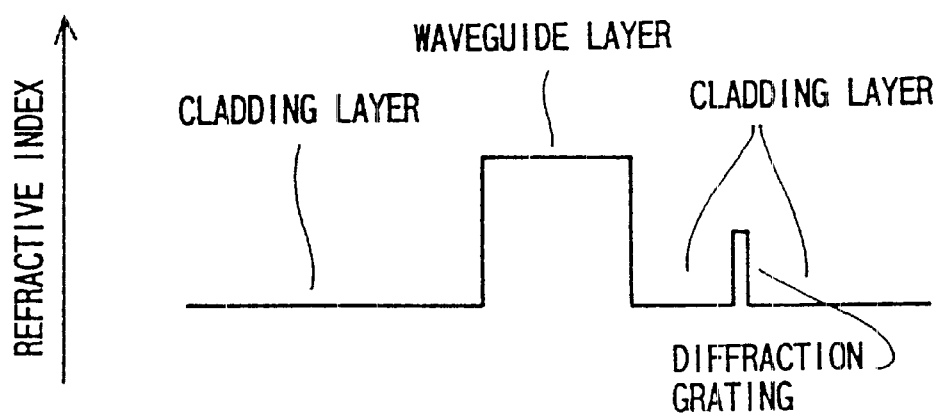
FIG. 19 is a schematic diagram showing a refractive index profile of a vertical waveguide structure of the second prior art technology.

FIG. 15 is a block diagram showing an example of a fiber laser according to the invention. As the optical fiber 210 is used a rare-earth-element-doped fiber a core part of which is doped with a rare earth element such as Er, Yb, and Nd. Light emitted from the semiconductor laser device 206 is injected as excitation light to an end of the optical fiber through a coupling system 209. An end of the optical fiber 210 is provided with highly reflective means for effecting feedback on the laser oscillation wavelength of the optical fiber, and the other end thereof is provided with a Fresnel reflector.

The injected excitation light is absorbed by the rare earth element dopant in the optical fiber, whereby stimulated emission is generated. The stimulated emission is reflected by the highly reflective means and Fresnel reflector and fed back, whereby laser oscillation is caused.

The power of part of the laser emission light is captured from the beam splitter 211 into detector 212, where the power is monitored and the output of the semiconductor laser 206 is controlled by the control circuit 208 so as to be maintained constant.

The light emitted from the semiconductor laser device 206 may be guided to the coupling system 209 by an optical fiber, or may be directly focused by a couple of lens on an end of the rare-earth-element-doped optical fiber.

In the case of the conventional fiber laser excitation a semiconductor laser of broad-area with transverse-multimode type (without wavelength control mechanism) has been used, whereas in the invention the DFB semiconductor laser of transverse-multimode type is preferably used, which brings the following advantages:

a) excitation in higher output is possible; and
b) a more stabilized fiber laser output can be obtained.

The fiber laser may have a shape of conventional single clad type or double clad type. In the case of a fiber laser of double clad type, since efficient laser oscillation is expected even in the case where the excitation light source has large mode-diameter, a desired effect can be obtained.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor laser device comprising:

an active layer;

upper and lower waveguide layers sandwiching the active layer therebetween;

upper and lower cladding layers sandwiching the active layer and the upper and lower waveguide layers therebetween; and a current narrowing structure defining a current-injection region for injecting current to the active layer, wherein a diffraction grating having a periodical structure in a resonance cavity direction is buried in any one of the waveguide layers, and the waveguide layer in which the diffraction grating is buried and the cladding layer adjoining to that waveguide layer forms an interface which is substantially flat in the resonance cavity direction.

2. The semiconductor laser device of claim 1, wherein the diffraction grating is buried within the upper waveguide layer and is present in at least a part of the current-injection region.

3. The semiconductor laser device of claim 1 or 2, wherein the device oscillates in a transverse multimode.

4. The semiconductor laser device of claim 3, wherein the current narrowing structure is located farther than the interface between the cladding layer and the waveguide layer from the active layer.

5. The semiconductor laser device of claim 1, wherein a confinement factor of a guided mode confined within a waveguide region as a total of the waveguide layer and the active layer is 0.8 or more.

6. The semiconductor laser device of claim 5, wherein a carrier blocking layer is interposed between the active layer and either of the upper and lower waveguide layers, the carrier blocking layer having a band gap larger than that waveguide layer.

7. A semiconductor laser module comprising:

a semiconductor laser device of claim 1;

an optical fiber receiving laser light from the semiconductor laser device; and a holder securing the semiconductor laser device and a laser light introducing portion of the optical fiber.

8. A rare-earth-element-doped fiber amplifier comprising:

a rare-earth-element-doped optical fiber; and a semiconductor laser device of any one of claims 1 through 6 as a rare-earth-element-pumping source, where the rare earth element is selected from one of Er, Yb and Nd.

9. A fiber laser doped with a rare earth element, comprising:

a semiconductor laser device of claim 1 as an excitation light source, wherein the rare earth element is selected from one of Er, Yb and Nd.

\* \* \* \* \*